(12) United States Patent
Lang

(10) Patent No.: US 9,317,946 B2
(45) Date of Patent: Apr. 19, 2016

(54) MEASURING DEVICE AND METHOD FOR MARKING COMMON TIMING POINTS

(71) Applicant: Rohde & Schwarz GmbH & Co. KG, Munich (DE)

(72) Inventor: Florian Lang, Gliching (DE)

(73) Assignee: ROHDE & SCHWARZ GMBH & CO. KG, Munich (DE)

(*) Notice: Subject to any disclaimer, the term of this patent is extended or adjusted under 35 U.S.C. 154(b) by 234 days.

(21) Appl. No.: 14/022,897

(22) Filed: Sep. 10, 2013

(65) Prior Publication Data

US 2014/0071136 A1 Mar. 13, 2014

(30) Foreign Application Priority Data

Sep. 10, 2012 (DE) .............................. 102012215966
Jul. 30, 2013 (DE) .......................... 1020132149819

(51) Int. Cl.
*G06T 11/20* (2006.01)
*G01R 13/02* (2006.01)
*G01R 19/04* (2006.01)

(52) U.S. Cl.
CPC .......... *G06T 11/206* (2013.01); *G01R 13/0245* (2013.01); *G01R 19/04* (2013.01)

(58) Field of Classification Search
None
See application file for complete search history.

(56) References Cited

U.S. PATENT DOCUMENTS 5,349,193 A * 9/1994 Mott et al. ................ 250/370.06
5,434,509 A * 7/1995 Blades ........................... 324/536
2002/0072880 A1 * 6/2002 Svanerudh et al. ........... 702/189
2003/0163266 A1   8/2003 Ward et al.
2008/0259082 A1  10/2008 Engholm et al.

FOREIGN PATENT DOCUMENTS

DE  3224836 C2  8/1984
GB  2103459 A   2/1983

OTHER PUBLICATIONS

Corral et al ("Ultra-Wideband Peak Power Limits", http://www.ieee802.org/15/pub/05/15-05-0290-00-003a-ultra-wideband-peak-power-limits.ppt, 2005, IEEE).*
Agilent ("Agilent Spectrum Analysis Basics", 2004, Agilent Technologies, Inc.).*
Anritsu Corporation, "Practical Tips on WCDMA Measurements", Application Note No. 11410-00378, Rev. B, Printed in United States, dated Sep. 2008, pp. 1-16.

* cited by examiner

*Primary Examiner* — Carlos Perromat
*Assistant Examiner* — Xin Sheng
(74) *Attorney, Agent, or Firm* — Ditthavong & Steiner, P.C.

(57) ABSTRACT

A measuring device has a storage unit, a processing unit and a display device for displaying a digitised and stored first partial signal and at least one digitised and stored second partial signal. In this context, the first partial signal and the second partial signal are partial signals of different bands of the multiband signal. The processing unit is embodied to display in a first window in the display device a first signal derived from the first partial signal and a first analysis line, and to display in a second window in the display device a second signal derived from the second partial signal and a first analysis line corresponding in time to the first analysis line of the first window.

17 Claims, 11 Drawing Sheets

MEASURING DEVICE AND METHOD FOR MARKING COMMON TIMING POINTS

RELATED REFERENCES

This application claims the benefit of German Patent Application DE 10 2012 215 966.5 filed on Sep. 10, 2012 and German Patent Application DE 10 2013 214 819.4 filed on Jul. 30, 2013.

FIELD OF THE INVENTION

The invention relates to a measuring device and a method for time-synchronous display and marking of common timing points of a digitised and stored first partial signal and at least one digitised and stored second partial signal of a multiband signal.

BACKGROUND

The accurate analysis of multiband signals has assumed increasing importance. Within the framework of this description, multiband signals are understood to mean a signal of a multiband base station with several carriers and different mobile-radio standards. In the case of a base station for multiband signals, it may, for example, be necessary to investigate whether events such as steep edges in one band have an influence on the signal quality of the adjacent band. In this case, it is particularly problematic for the user to establish the time coherence between the two bands.

A device for displaying wave forms is known from DE 32 24 836 C2, which writes, for example, two different signals time synchronously with one another into different storage regions. In this context, a signal can be displayed in the associated display device with two different time axes, whereas a marker marks the timing points in the two displays which represent the same timing point. The disadvantage with DE 32 24 836 C2 is that the manner in which the signal is displayed allows the user to detect an error in the signal only with difficulty. Moreover, a processing of multiband signals is not shown.

A measuring device which shows synchronous markings in several displays is also disclosed in document US/2003/163266 A1. However, this measuring device is also incapable of processing multiband signals.

Document US 2008/0259082 A1 also discloses a measuring device which shows synchronous markings in various displays. However, with this measuring device also, it is not possible to display multiband signals.

Measuring devices which allow various displays of a signal in different windows are also disclosed in the document "ANRITSU Corporation: Practical Tips on WCDMA Measurements, Application Note No. 11410-00378 September 2008".

SUMMARY

The measuring device according to the invention preferably provides a storage unit, a processing unit and a display device and is used for displaying a digitised and stored first partial signal and at least one digitised and stored second partial signal. In this context, the first partial signal and the second partial signal are different bands of the multiband signal. The processing unit is accordingly embodied to display a first signal derived from the first partial signal and a first analysis line in a first window in the display device and to display in a second window a second signal derived from the second partial signal and a first analysis line corresponding in time to the first analysis line from the first window. Accordingly, it is possible for a user to determine the causes for errors in the various partial signals in a very simple and clearly visualised manner.

By preference, the processing unit calculates the characteristic of an error value over a given time period from the first partial signal and displays this in a first window in the display device. Following this, the processing unit inserts a first analysis line in the first window at the timing point at which the characteristic of the error value overshoots a threshold value loaded by the processing unit from a storage unit. It is particularly advantageous that the measuring device can analyse the different partial signals of a multiband signal, whereas the measuring device calculates from a first partial signal a characteristic of an error value over a given time period. The given time period is an adjustable time period which preferably has the length of one frame. In this context, the processing unit can compare the error values with a threshold value stored in a storage unit and insert an analysis line at the timing point at which the error value overshoots the threshold value stored in the storage unit. This allows the user to see this timing point directly in the characteristic of the error value.

The method according to the invention is preferably used for the display of a digitised and stored first partial signal and at least one digitised and stored second partial signal of a multiband signal and additionally provides a storage unit, a processing unit and a display device. In a first method step, a characteristic of an error value of the first partial signal is calculated by the processing unit over a given time period. In a second method step, the characteristic of the error value is displayed by the processing unit in a first window of the display device. In a third method step, the processing unit inserts a first analysis line at the timing point at which the characteristic of the error value overshoots a threshold value loaded by the processing unit from a storage unit.

With the method according to the invention, it is particularly advantageous that an analysis line automatically marks the timing point of the characteristic of the error value of a first partial signal, which can be relevant for the analysis of the multiband signal, especially the adjacent bands of the affected partial signal. As a result, the user no longer needs to work through the characteristics of all partial signals of the multiband signal in order to find a relevant place for further analysis.

A further advantage is achieved with the method according to the invention if the processing unit inserts the first analysis line in the first window at the first timing point at which the error value overshoots the threshold value loaded from a storage unit, and/or if the processing unit inserts the first analysis line in the first window at the timing point at which the error value is highest and at the same time overshoots the threshold value loaded from a storage unit, and/or if the processing unit inserts further analysis lines in the first window at further timing points at which the error values overshoot the threshold value loaded from a storage unit. Dependent upon the selected setting, the user of the measuring device is notified directly of the first timing point at which the error value overshoots a threshold value, and/or the user of the measuring device is notified of all timing points at which the error value is highest, and/or the user is notified of all timing points at which the error values overshoot the set threshold value, so that these timing points can then be automatically analysed with another program.

Moreover, an advantage is achieved with the measuring device according to the invention if the processing unit calculates a characteristic of the power from the first partial signal and displays this in a second window in the display device, and if the processing unit inserts a first analysis line in the second window at the timing point which corresponds to the timing point at which the first analysis line is displayed in the first window, and/or if the processing unit calculates a characteristic of the power from the second partial signal and displays it in a third window in the display device, and if the processing unit inserts a first analysis line in the third window at the timing point which corresponds to the timing point at which the first analysis line is displayed in the first window. Accordingly, the user can recognise immediately in which slot an error is present, or s/he can determine the cause for the increased error value in another partial signal of the multi-band signal because the signal components are shown corresponding to one another in time.

Moreover, an advantage is achieved with the measuring device according to the invention if the processing unit displays at least parts of the first partial signal and/or of the second partial signal in further windows, whereas the display does not contain a time-dependent axis, whereas an indicator, especially in the form of a symbol or an alphabetic abbreviation, signals within the further window that the error value at which the processing unit has inserted a first analysis line in the first window flows into the display. Such an indicator is particularly meaningful if, for example, the power of the code domain is displayed, so that the user is informed that an error is present in this display.

An advantage is also achieved with the measuring device according to the invention if the first partial signal is a WCDMA signal (Wideband Code Division Multiple Access), or if the error value is an EVM value (Error Vector Magnitude) and if the characteristic of the EVM value is plotted in the first window against several chips, because such a characteristic of the EVM value provides information about an error demodulation. In this context, it is advantageous if the power is plotted in the second window against the slots (Power vs Slot) and/or if the power of the code domain is plotted in the second window, and/or if the second partial signal is a TDMA signal (Time Division Multiple Access), especially a GSM signal (Global System for Mobile Communications). It is also advantageous if the power of the second partial signal is plotted in the third window in the time domain. Especially the steep edges of a GSM burst can have negative impact on the adjacent bands. Such a GSM burst can therefore influence the characteristic of the EVM value of a WCDMA signal negatively. On the basis of this time-synchronous display of the various partial signals, a user can recognise that an error within the EVM characteristic of the WCDMA signal is not to be found in the amplifiers or the signal processing for the WCDMA signal, but is possibly attributable to the edge of the GSM burst. The facts relating to the measuring device as described in this section naturally also apply to the facts relating to the method and vice versa.

Furthermore, in one advantageous embodiment of the method according to the invention, an advantage is achieved if, instead of a first analysis line or in addition to a first analysis line, the processing device plots a first analysis range in the first window in the display device, which extends over a plurality of time-coherent error values, whereas a first error value forms a first end of the first analysis range, whereas this first error value overshoots the threshold value loaded from a storage unit and whereas a further error value forms a second end of the first analysis range, whereas this further error value also overshoots the threshold value loaded from a storage unit, whereas the error values disposed between the first end and the second end of the analysis range all overshoot the threshold value loaded from a storage unit. Such a display is significantly more logically arranged than the addition of further analysis lines. For further processing, the corresponding signal components which are disposed within the first analysis range can be transferred directly to another application.

In the case of the method according to the invention, it is also advantageous if the processing unit plots the first analysis range instead of a first analysis line or in addition to a first analysis line, if the error values which are disposed between the first end and the second end of the analysis range to be plotted overshoot a number stored in the storage unit. In this case, it can be ensured that an analysis range is only plotted if a given number of time-successive error values overshoot a specified number.

BRIEF DESCRIPTION OF THE DRAWINGS

Various exemplary embodiments of the invention are described by way of example below with reference to the drawings. Identical subject matters provide the same reference numbers. The corresponding figures of the drawings show in detail.

DETAILED DESCRIPTION OF THE EMBODIMENTS

Figure 1:
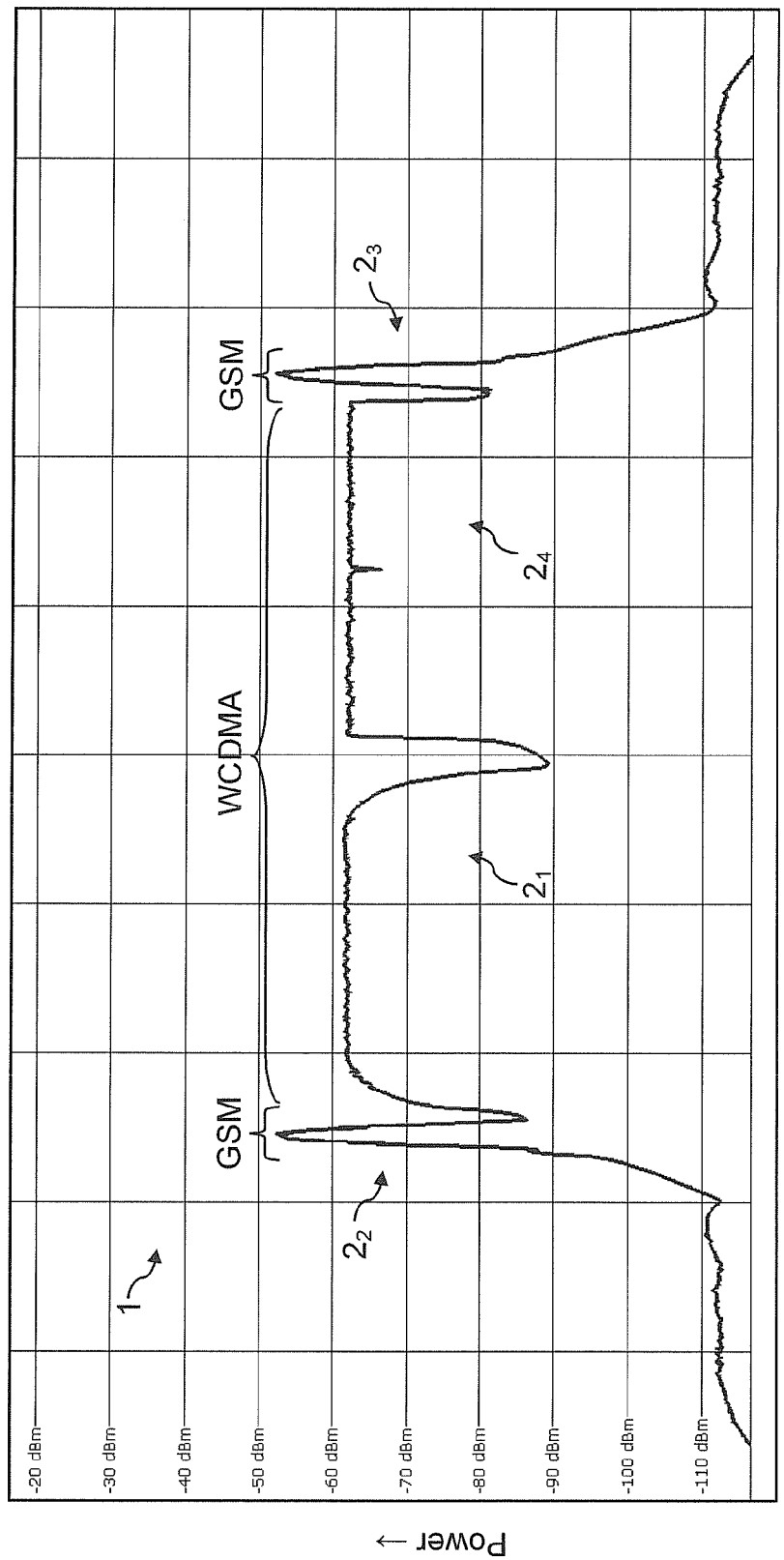
FIG. 1 an exemplary multiband signal with a first partial signal, a second partial signal, a third partial signal and a fourth.

FIG. 1 shows an exemplary multiband signal 1 with a first partial signal $2_1$, a second partial signal $2_2$, a third partial signal $2_3$ and a fourth partial signal $2_4$. The exemplary multiband signal 1 is the signal around a multiband base station 12, which is not illustrated, whereas the multiband signal 1 comprises several carriers of different mobile-radio standards. Accordingly, the spectral characteristic of the multiband signal 1 is illustrated in FIG. 1. In the exemplary embodiment from FIG. 1, the first partial signal $2_1$ and the fourth partial signal $2_4$ is a WCDMA signal. The second partial signal $2_2$ is a GSM signal. The third partial signal $2_3$ is also a GSM signal. In this context, the WCDMA signals are positioned in such a manner that a GSM signal adjoins their lower frequency range and their upper frequency range in each case. Steep edges within a GSM burst in the second partial signal $2_2$ and/or in the third partial signal $2_3$ can influence the demodulation of the WCDMA signals. It is, of course, also possible for the first partial signal $2_1$, the second partial signal $2_2$, the third partial signal $2_3$ and/or the fourth partial signal $2_4$ to be an LTE signal (long-term evolution) or a WIMAX signal (worldwide interoperability for microwave access).

The following section explains how the multiband signal 1 illustrated in FIG. 1 is registered, and how the individual partial signals $2_1, 2_2, 2_3, 2_4$ can be processed. Otherwise, the multiband signal 1 can also comprise an arbitrary number of further partial signals $2_1, 2_2, 2_3$ and $2_4$. For reasons of visual clarity, only four partial signals $2_1, 2_2, 2_3$ and $2_4$ are shown in FIG. 1.

Figure 2:
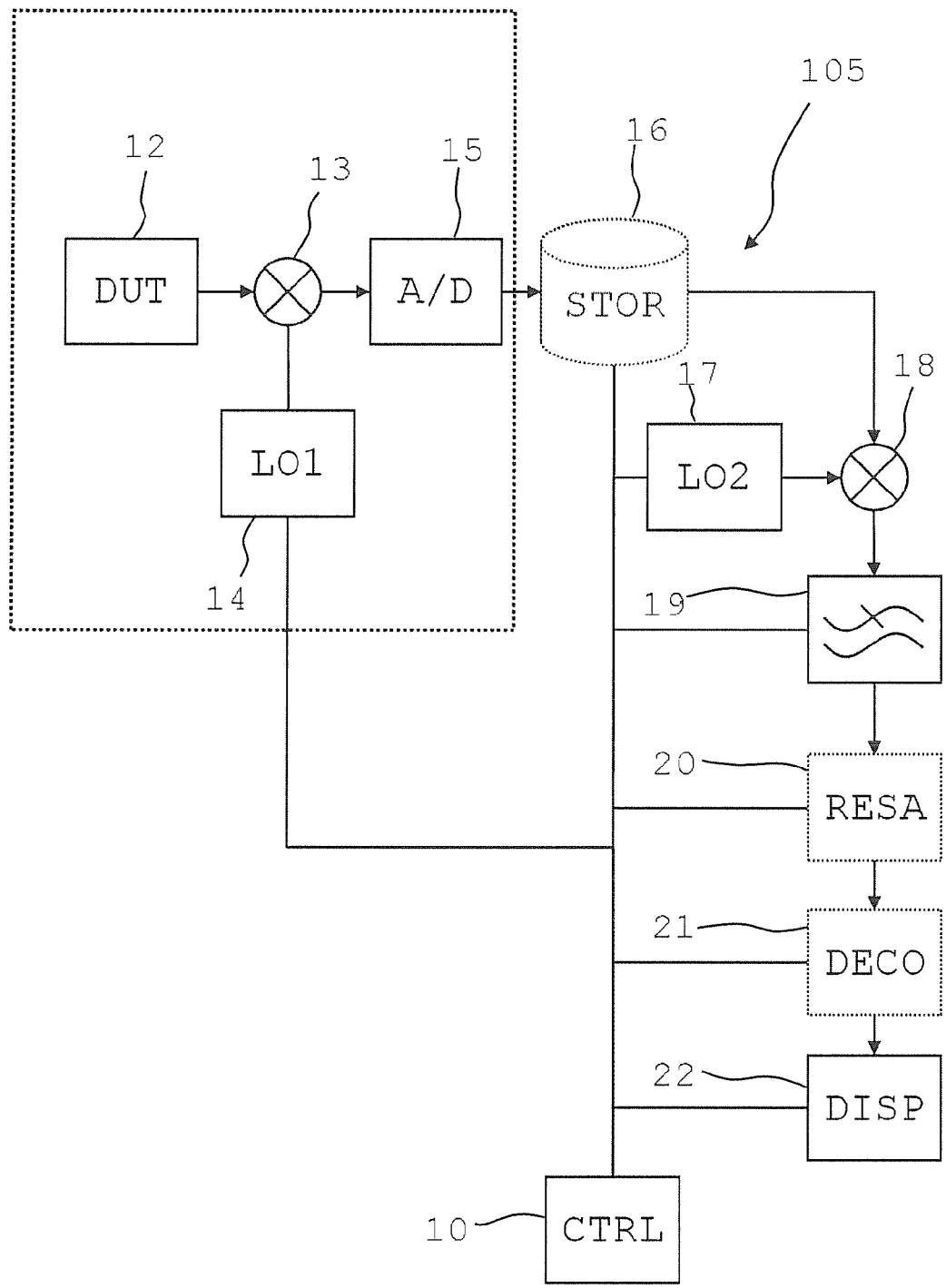
FIG. 2 an exemplary structure of the measuring device according to the invention for registering the various partial signals from the multiband signal.

FIG. 2 shows a first exemplary embodiment of the measuring device according to the invention. A device under test 12, especially a multiband base station 12 is connected to the mixer 13. The mixer 13 is connected to a local oscillator 14 and an analog-digital converter 15. In this context, the local oscillator 14 is also connected to the processing unit 10 which generates the necessary control instructions. The mixer 13, the local oscillator 14 and the analog-digital converter 15 together form a high-frequency processing device. The device under test 12 is not a part of this.

The analog-digital converter 15 is connected to a storage unit 16. The storage unit 16 is also connected to the processing unit 10. The storage unit 16 is further connected to a digital mixer 18 which is connected to a digital local oscillator 17. This is also connected to the processing unit 10. The mixer 18 is further connected to a filter 19. The filter 19 is also connected to the processing unit 10. Moreover, the filter 19 is connected to a data-rate matching device 20. This is also connected to the processing unit 10. Additionally, it is connected to a decoding device 21 which is also connected to the processing unit 10. Furthermore, the decoding device 21 is connected to a display device 22 which is also connected to the processing unit 10.

The device under test 12 generates a multiband signal 1. This is transmitted to the mixer 13. In this context, the signal contains several partial signals $2_1, 2_2, 2_3, 2_4$. These can be from different telecommunications standards. The mixer 13 mixes the multiband signal 1 with a local oscillator signal which is generated by the local oscillator 14 under the control of the processing unit 10. The resulting intermediate-frequency signal contains the entire information content of the multiband signal 1, but provides a different mid-frequency. The intermediate-frequency signal is then digitised by the analog-digital converter 15 to form a digital combined signal. This digital combined signal is then stored by the storage unit 16. The digital combined signal can be displayed on the display device 22 corresponding to FIG. 1 as a digital multiband signal 1.

Controlled by the processing unit 10, the storage unit 16 outputs the stored digital combined signal to the mixer 18 which mixes it with a first local oscillator signal. This local oscillator signal is generated by the local oscillator 17 which is controlled by the processing unit 10. The signal processing is implemented after the analog-digital converter 15 in a digital manner, that is, it is a digital mixing with a digital signal. The frequency of the local oscillator signal is accordingly selected in such a manner that the mid-frequency of the first digital combined signal resulting from the mixing corresponds to the mid-frequency of the partial signal $2_1, 2_2, 2_3, 2_4$ under investigation. The frequency of the digital combined signal is therefore displaced by the mixing through the mixer 18 in such a manner that the resulting first digital combined measurement signal can be readily further processed.

This signal is now routed to the digital filter 19. The digital filter 19 restricts the bandwidth of the first digital combined measurement signal to the bandwidth of the partial signal $2_1, 2_2, 2_3, 2_4$ currently under investigation. The filter 19 is preferably a low-pass filter. A band-pass filter can be used as an alternative. As a starting signal, the digital filter 19 generates a first digital partial signal $2_1$. This first digital partial signal $2_1$ now contains only the information content of the currently investigated partial signal $2_1, 2_2, 2_3$ or $2_4$. It is then routed to the data-rate matching device 20 which removes unnecessary data-points for the investigation of the respective partial signal $2_1, 2_2, 2_3$ or $2_4$ and accordingly reduces the data rate of the first digital partial signal $2_1, 2_2, 2_3, 2_4$. In this context, the reduction takes place dependent upon the respective communications standard. In this context, running through the data-rate matching device 20 is optional.

The resulting partial signal $2_1, 2_2, 2_3, 2_4$ is supplied to a decoding device $2_1$ which decodes the signal. The decoded partial signal $2_1, 2_2, 2_3, 2_4$ is supplied to the display device 22 and displayed by the latter. Running through the decoding device 21 is also optional in this context. As an alternative, the non-decoded data can also be displayed on the display device 22. The digital filter 19, the data-rate matching device 20, the decoding device 21 and the display device 22 are accordingly also controlled by the processing unit 10. The data-rate matching device 20 is also adjusted by the processing unit 10 for the partial signal $2_1$, $2_2$, $2_3$, $2_4$ currently under investigation. This also applies for the decoding device 21 and the display device 22.

After a first partial signal $2_1$ of the stored digital multiband signal 1 has been processed as described above, this procedure is repeated for a second partial signal $2_2$ and possibly for further partial signals $2_3$, $2_4$. The processing unit 10 now adjusts the local oscillator signal in such a manner that the mid-frequency of the signal resulting from the mixing corresponds to the mid-frequency of the partial signal $2_2$, $2_3$, $2_4$ now under investigation. The digital filter 19 is also adjusted to allow the bandwidth of the partial signal $2_2$, $2_3$, $2_4$ under investigation to pass and to remove signal components exceeding this. By analogy with the procedure described above, a second digital partial signal $2_2$ is generated and further processed as already explained. The same applies for each of the arbitrary number of further partial signals $2_3$, $2_4$.

Alternatively, the digital multiband signal 1 can be further processed directly, provided only one partial signal $2_1$, $2_2$, $2_3$ or $2_4$ is to be investigated. However, if a second partial signal $2_2$, $2_3$, $2_4$ is to be investigated, the digital combined measurement signal 105 must be stored by the storage device 16 as described and further processed in the form of the stored digital multiband signal 1.

In this context, the processing of several partial signals through the functional blocks 16-22 is implemented in successive segments. That is to say, initially, a time segment of a first partial signal $2_1$ is processed. Following this, an identical time segment of a second partial signal $2_2$ is processed. When all of the partial signals $2_1$, $2_2$, $2_3$, $2_4$ currently to be displayed have been processed, the procedure is continued with the next time segment of the first partial signal $2_1$, $2_2$, $2_3$, $2_4$. Accordingly, the recording by the storage device 16 takes place continuously.

A parallel processing of several partial signals is also possible as an alternative. For this purpose, the measuring device provides at least a twofold embodiment of the functional blocks 17-21. In this case, the control device 10 controls these functional blocks 17-21 in a parallel manner. The functional blocks 17-21 are preferably embodied in an FPGA (Field Programmable Gate Array). A segment by segment recording of the stored digital combined signal 105 is also possible.

The next section considers the identical segments, that is to say, segments corresponding to one another in time, of the different partial signals $2_1$, $2_2$, $2_3$, $2_4$. If an unusual EVM value is present within one time segment which, in particular, corresponds to a frame in a partial signal, the corresponding time segments of the other partial signals $2_1$, $2_2$, $2_3$, $2_4$ are then also used for comparison and displayed accordingly.

Figure 3A:
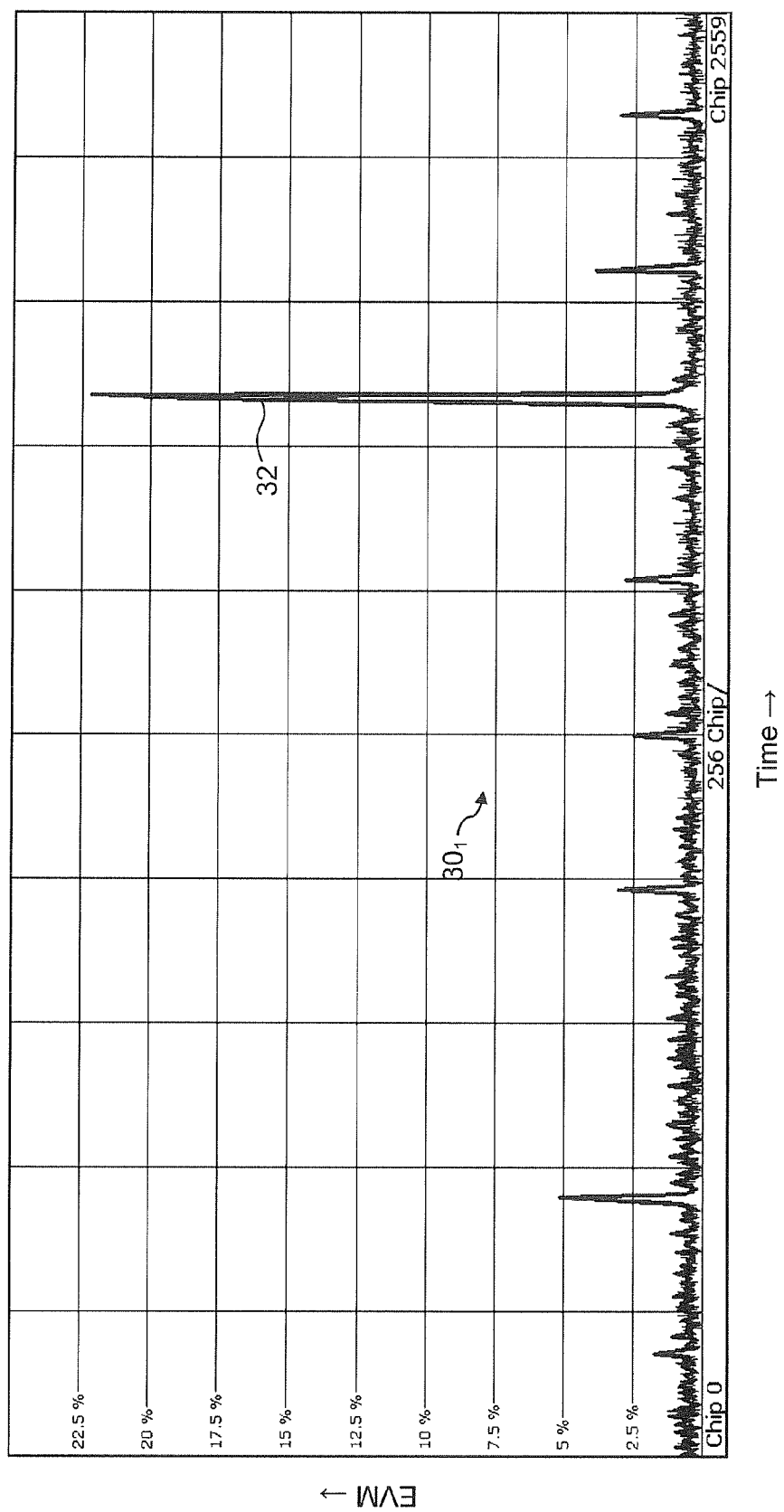
FIG. 3A a first window in the display device in which a characteristic of an error value of the first partial signal is displayed.

FIG. 3A shows a first window in the display device 22, in which a characteristic of an error value $30_1$ of the first partial signal $2_1$ is displayed. The first partial signal $2_1$ is preferably a WCDMA signal. The error value is preferably an EVM value $30_1$ of the first partial signal $2_1$. The window in which the EVM value $30_1$ of the first partial signal $2_1$ is displayed provides a time coordinate axis. The EVM value $30_1$ is accordingly plotted against time. The time axis can be scaled in microseconds or in chips, whereas plotting the EVM value $30_1$ against the various chips is more advantageous. In FIG. 3A, it is clearly evident that the characteristic of the EVM value $30_1$ provides a peak 32. This peak 32 indicates a problem in the demodulation of the WCDMA signal. With regard to this peak 32, a user has hitherto only been able to determine that such a problem exists, but not to determine the possible causes rapidly and accurately.

Figure 3B:
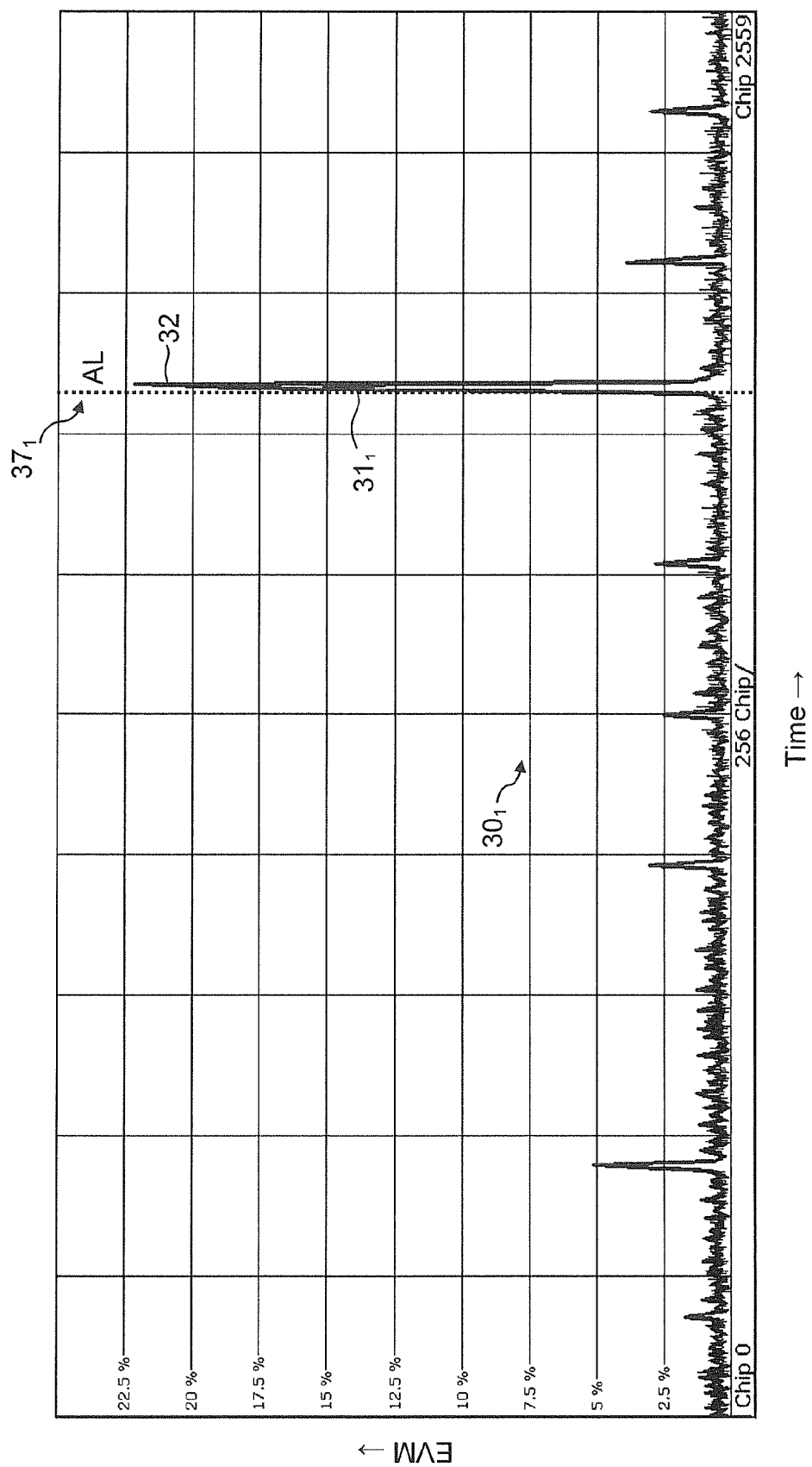
FIG. 3B the first window in the display device in which the characteristic of the error value of the first partial signal is displayed and in which an analysis line according to the invention is plotted.

FIG. 3B once again shows the first window from FIG. 3A in which the characteristic of the EVM value $30_1$ of the first partial signal $2_1$ is displayed. At the same time, the processing unit 10 has inserted a first analysis line $31_1$ at the position of the characteristic of the EVM value $30_1$ which overshoots a given threshold value stored in a storage unit 16. The processing unit 10 consequently calculates the corresponding EVM value $30_1$ for every configuration point of the first partial signal $2_1$.

Corresponding to the resolution of the display device 22, the individual EVM values are decimated for the display. The decimation can be implemented in the processing unit 10 by means of a peak detector, an average detector or a max detector. By preference, the characteristic of the EVM value $30_1$ is displayed against a frame in the first window in the display device 22.

The first analysis line $31_1$ is inserted by the processing unit 10 in the first window at the first timing point at which the characteristic of the EVM value $30_1$ overshoots the threshold value loaded from the storage unit 16. It is also possible for the processing unit 10 to insert the first analysis line $31_1$ in the first window at the timing point at which the characteristic of the EVM value $30_1$ is highest, whereas this EVM value $30_1$ must, at the same time, also overshoot the threshold value loaded from a storage unit 16. This threshold value can be entered by a user, or it can be taken from the underlying communications standard.

The first analysis line $31_1$ is preferably displayed in a colour which is not allocated to any partial signal $2_1$, $2_2$, $2_3$, $2_4$ and which is also distinct from the background and the structuring of the first window of the display device 22. The first analysis line $31_1$ can also be displayed in another pattern. For example, the first analysis line $31_1$ need not be a completely continuous line; it can also be a dotted line and/or a dashed line. The first analysis line $31_1$ can also be displayed in a transparent manner, whereas its contrast is lower than the contrast of the characteristic of the EVM value 30 with reference to the background colour and possible structuring of the first window of the display device 22. The first analysis line $31_1$ is a vertical line which is preferably embodied over the entire height of the first window of the display device 22. The first analysis line $31_1$ is preferably marked with an indicator $37_1$, especially a symbol or an alphabetic abbreviation, such as "AL". As soon as several analysis lines are embodied, this indicator can be further provided with a number which is incremented continuously dependent upon the number of analysis lines.

The first analysis line $31_1$ is preferably inserted at the timing point in the first window at which the characteristic of the EVM value $30_1$ overshoots the threshold value stored in the storage unit 16 with a positive gradient. It is also possible for a hysteresis value to be stored in the storage unit 16 in addition to the threshold value. This hysteresis value means that the processing unit 10 plots the analysis line $31_1$ in the first window only when the characteristic of the EVM value $30_1$ has passed completely through the hysteresis range.

Figure 3C:
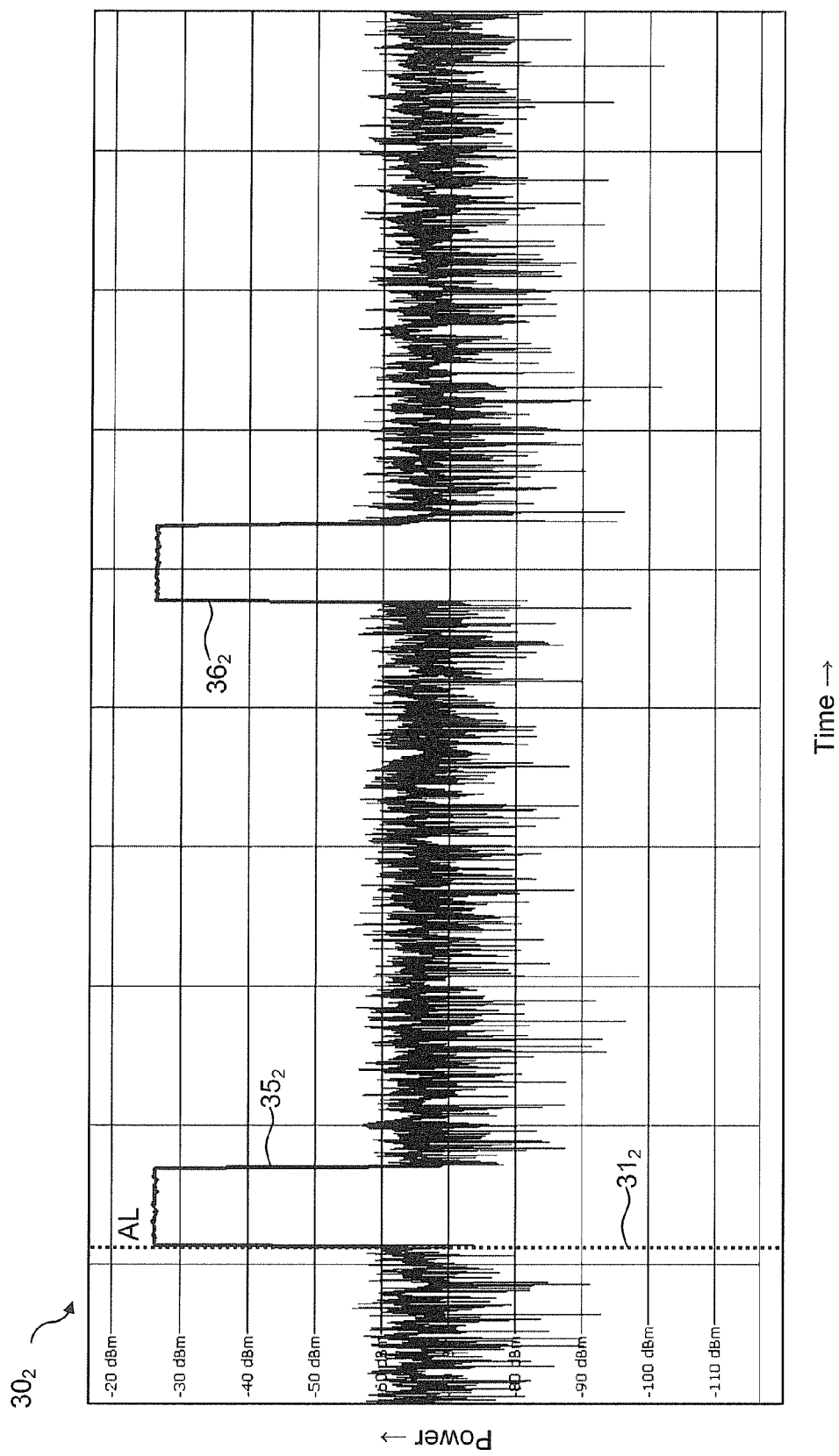
FIG. 3C a third window in the display device in which a power of the second partial signal is displayed in the time domain and in which the analysis line according to the invention is plotted at the timing point which corresponds to the timing point at which the analysis line is plotted in the first window.

FIG. 3C shows a third window in the display device 22 in which a power $30_2$ of the second partial signal $2_2$ is displayed in the time domain. The second partial signal $2_2$ is preferably a GSM signal. The time axis of the second window covers the same time duration as the time axis in the first window. However, the time duration in FIG. 3C is preferably indicated in microseconds or milliseconds. Two GSM bursts $35_2$, $36_2$ are clearly evident in FIG. 3C. In this context, the processing unit 10 has calculated from the second partial signal $2_2$ a time characteristic of the power $30_2$, that is, the characteristic $30_2$ power in the time domain, and displayed it in the third window in the display device 22. The processing unit 10 has also inserted a first analysis line $31_2$ in the third window at the timing point which corresponds to the timing point at which the first analysis line $31_1$ is displayed in the first window. This is not a problem because, as explained with regard to FIG. 2, segments of the partial signals $2_1$, $2_2$, $2_3$, $2_4$ are always generated with an identical length in time, whereas the time duration of one segment is preferably 1 frame and accordingly 10 ms. The time coherence between the individual partial signals $2_1$, $2_2$, $2_3$, $2_4$ is not lost through the segment by segment calculation which is implemented in succession or in parallel.

In this context, the first analysis line $31_2$ in the third window of the display device 22 provides the same colour and the same shape as the first analysis line $31_1$ in the first window of the display device 22. To increase visual clarity, the analysis lines $31_1$, $31_2$, which mark the same timing point in the various windows, have the same reference numbers, whereas the index is matched to the respective window. When observing FIG. 3C, it is evident to a user that the steep edge of the GSM burst $35_2$ could possibly have been responsible for the excessively high EVM value $30_1$ of the WCDMA signal and this edge must be investigated in greater detail.

Figure 3D:
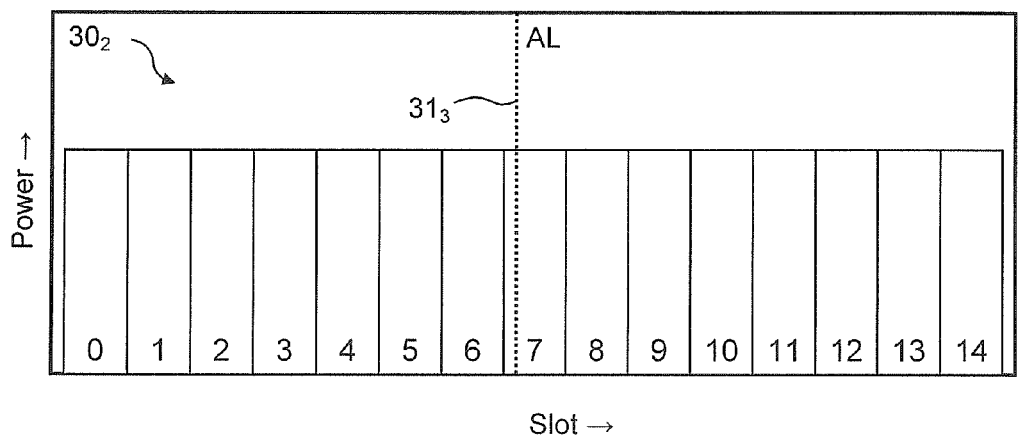
FIG. 3D a second window in the display device in which a power is plotted against the slots of the first partial signal and in which the analysis line according to the invention is plotted at the timing point which corresponds to the timing point at which the analysis line is plotted in the first window.

FIG. 3D shows a second window in the display device 22 in which a power $30_3$ of the first partial signal $2_1$ is displayed against the various slots. As already explained, the individual partial signals $2_1$, $2_2$, $2_3$, $2_4$ are processed segment by segment by the measuring device 12, so that the time coherence is not lost. In this context, one segment preferably corresponds to a frame, whereas a frame is made up of 15 slots and is 15 ms long. It is clearly evident that the processing unit 10 calculates from the first partial signal $2_1$ the characteristic of the power $30_3$ against the slots and displays this characteristic in a second window in the display device 22. The power $30_3$ is therefore also plotted against a time axis. The processing unit 10 accordingly inserts the first analysis line $31_3$ in the second window at the timing point which corresponds to the timing point at which the first analysis line $31_1$ is displayed in the first window. In the exemplary embodiment from FIG. 3D, a user can see that the peak 32 of the EVM value $30_1$ is plotted in slot 7.

Figure 3E:
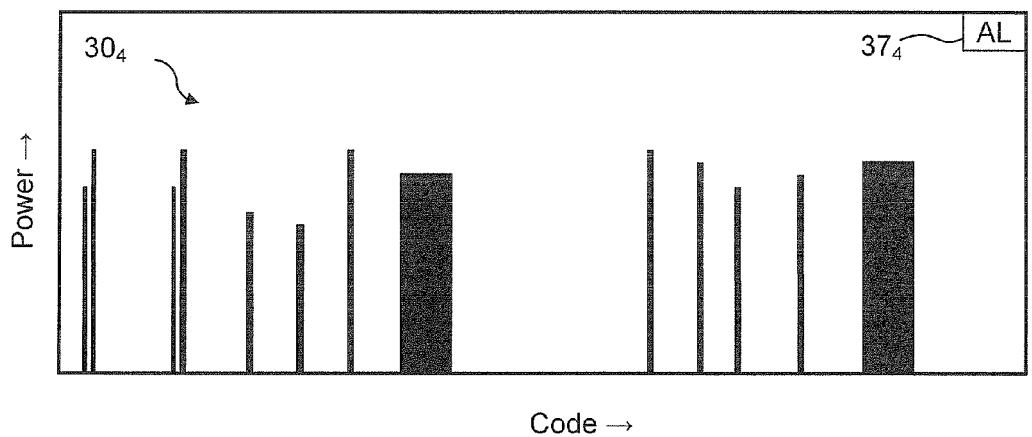
FIG. 3E a second window in the display device in which a power of the code domain of the first partial signal is displayed together with an indicator which indicates that an error value which is marked with an analysis line has flowed into the calculation for the display.

FIG. 3E shows a second window in the display device 22 in which a power $30_4$ of the code domain of the first partial signal $2_1$ is displayed. In this context, the power $30_4$ is not displayed on a time axis. On the contrary, the powers $30_4$ of the individual codes used are compared with one another. As a result of the fact that no time-dependent axis is present in the window from FIG. 3E, it is not possible to plot an analysis line corresponding to the analysis line $31_1$. Accordingly, an indicator $37_4$, especially in the form of a symbol or an alphabetic abbreviation, is used to signal to the user that the error value $30_1$, especially the EVM error $30_1$, at which the processing unit 10 has inserted a first analysis line $31_1$ in the first window, has indeed flowed into the display. By preference, such an indicator $37_4$ is positioned at the edge or in the corner of the corresponding window. In particular, the indicator $37_4$ provides the same abbreviation with which the analysis line $31_1$ is also marked. For example, the abbreviation "AL" or "AL 1" can be inserted, which is intended to signal that the error value $30_1$ at which the corresponding analysis line $31_1$ is inserted in the first window, has been included in the calculation. Accordingly, the indicator $37_4$ provides the same colour and/or the same pattern as the first analysis line $31_1$ corresponding to it.

In the display device 22, which is preferably a touch-sensitive screen, the first window, the second window, the third window and optionally further windows can be displayed in parallel, at the same time. Accordingly, the individual windows are arranged side-by-side and/or one above the other. In particular, the EVM value $30_1$ of the partial signal $2_1$ can be displayed in parallel against the various chips together with the power of the first partial signal $2_1$ against the individual slots and against the code domain in three different windows. In parallel with this, the power of the second partial signal $2_2$ can also be displayed in the time domain. The windows can also be displayed sequentially relative to one another.

Figure 4A:
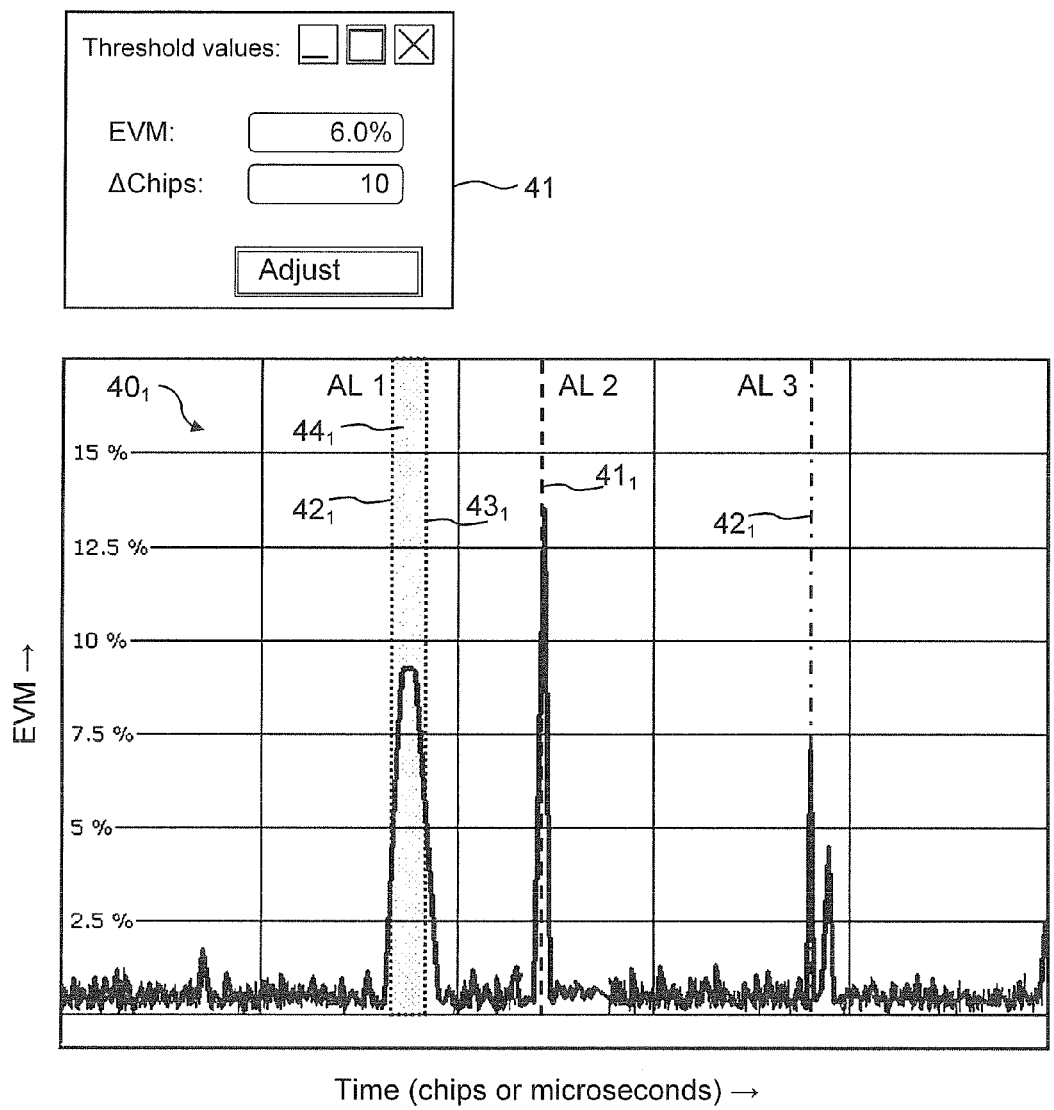
FIG. 4A the first window in the display device in which the error value of the first partial signal is displayed and in which several analysis lines according to the invention and an analysis range are plotted.

FIG. 4A shows the first window in which the characteristic for the EVM value $40_1$ of the first partial signal $2_1$ is displayed and in which several analysis lines $41_1$, $42_1$ according to the invention are displayed and plotted in the additional analysis range $44_1$.

It is clearly evident that the characteristic of the EVM value $40_1$ provides several maxima. A first analysis line $41_1$ is inserted by the processing unit 10 at the timing point at which the characteristic of the EVM value $40_1$ provides the highest value. A second analysis line $42_1$ is inserted at a timing point at which the characteristic of the EVM value $40_1$ again overshoots a threshold value stored in the storage unit 16. The first analysis line $41_1$ and the second analysis line $42_1$ preferably provide different colours and/or different patterns. Moreover, the colours of the two analysis lines $41_1$, $42_1$ differ from the colours used in the first window, which are assigned especially to the characteristic of the EVM value $30_1$, and from the background and the structuring of the window.

It is clearly evident that the threshold value for the EVM value 30, after the reaching of which the processing unit 10 inserts an analysis line $41_1$, $42_1$ or an analysis range $44_1$ at the corresponding timing point, can be entered in an entry field 41. Moreover, the processing unit 10 can plot a first analysis range $44_1$ in the first window instead of a first analysis line $41_1$ or instead of further analysis lines $42_1$.

The processing unit 10 can also plot a first analysis range $44_1$ in the first window in addition to existing analysis lines $41_1$, $42_1$. The first analysis range $44_1$ extends over a plurality of time-coherent EVM values $40_1$. Accordingly, a first EVM value which overshoots a threshold value loaded from the storage unit 16 forms a first end $42_1$ of the analysis range $44_1$. A further EVM value which overshoots a threshold value loaded from a storage unit forms a second end $43_1$ of the analysis range $44_1$. Exclusively EVM values which all overshoot the threshold value loaded from a storage unit 16 are disposed between the first end $42_1$ and the second end $43_1$ of the analysis range $44_1$. EVM values $40_1$ which occur in time before the EVM value which forms the first end $42_1$ do not overshoot the threshold value loaded from a storage unit 16. The same also applies for EVM values $40_1$, which are directly adjacent in time to the EVM value which forms the second end $43_1$ of the analysis range $44_1$. The analysis range $44_1$ consequently marks an area. The area marked by the analysis range $44_1$ is preferably displayed in a different colour and/or in a different pattern from the characteristic of the EVM value $40_1$. The colour is also not identical to the background colour of the first window or the structuring of the first window.

The analysis lines $41_1$, $42_1$ also provide a different colour from the area marked by the analysis range $44_1$. The area marked by the analysis range $44_1$ can also be displayed in a transparent manner with regard to its contrast by comparison with the characteristic of the EVM value $40_1$. In FIG. 4A, for example, the characteristic of the EVM value $40_1$ is also displayed within the area marked by the analysis range $44_1$.

By preference, the processing unit 10 only plots such an analysis range $44_1$, if the EVM values which are disposed between the first end $42_1$ and the second end $43_1$ of the analysis range $44_1$ to be plotted overshoot a number stored in the storage unit 16. This stored number can be entered, for example, via the entry field 41. In the exemplary embodiment from FIG. 4A, at least 10 chips must be disposed between the first end $42_1$ and the second end $43_1$ which form the analysis range $44_1$, whereas the EVM value $40_1$ for every chip must overshoot the threshold value stored in the storage unit 16. Instead of the number of chips, a time-duration, for example, in microseconds or milliseconds, can also be specified.

Figure 4B:
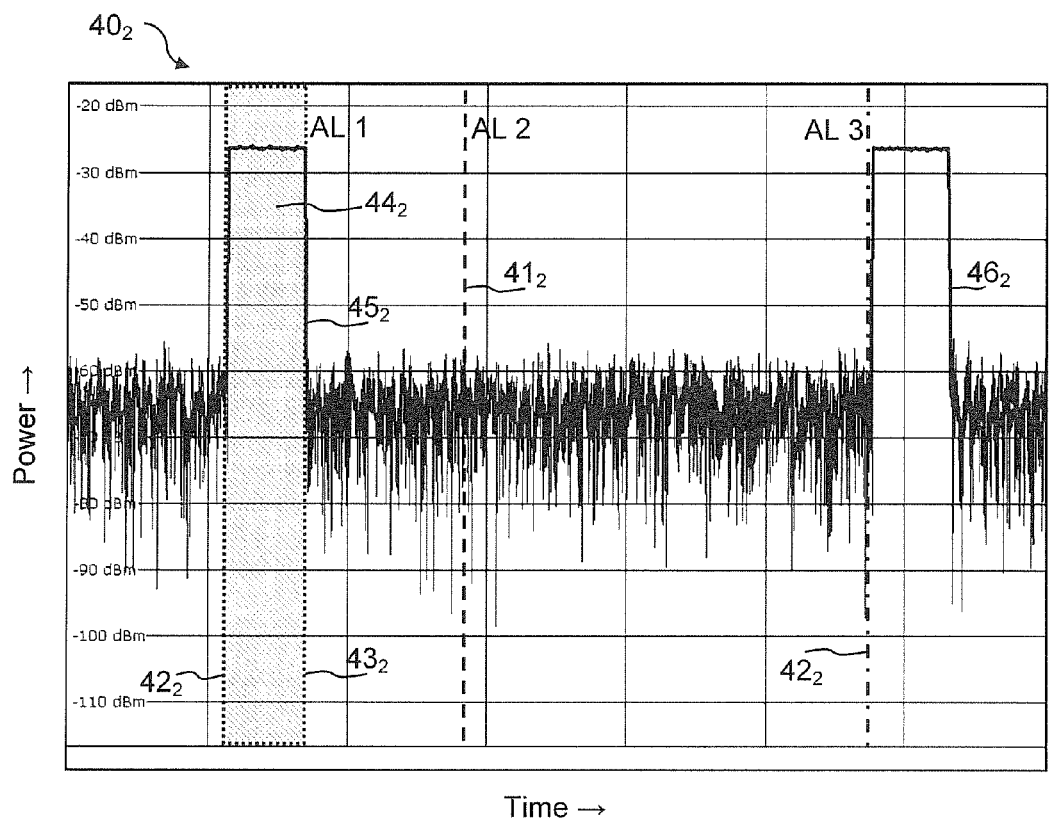
FIG. 4B a third window in the display device in which a power of the second partial signal is displayed in the time domain and in which several analysis lines according to the invention and an analysis range are plotted at the timing points which correspond to the timing points at which these are also plotted in the first window.

FIG. 4B shows a third window in the display device 22 in which a power $40_2$ of the second partial signal $2_2$ is displayed in the time domain. In this context, the processing unit 10 calculates from the second partial signal $2_2$ the characteristic of the power $40_2$ and displays this in the third window. Moreover, the processing unit 10 inserts a first analysis range $44_2$ in the third window in the time range which corresponds to the time range in which the first analysis range $44_1$ is displayed in the first window. It is clearly evident that the entire first GSM burst $45_1$ can be responsible for the increased EVM value.

The processing unit 10 also inserts the first analysis line $41_2$ into the third window at the timing point which corresponds to the timing point at which the first analysis line $41_1$ is inserted in the first window. It is evident that the characteristic of the GSM signal, that is, of the second partial signal $2_2$, is very probably not responsible for the increased EVM value at which the first analysis line $41_1$ is inserted.

However, the situation looks different with the second analysis line $42_2$ which is inserted by the processing unit directly on the rising edge of the second GSM burst $35_2$.

Figure 4C:
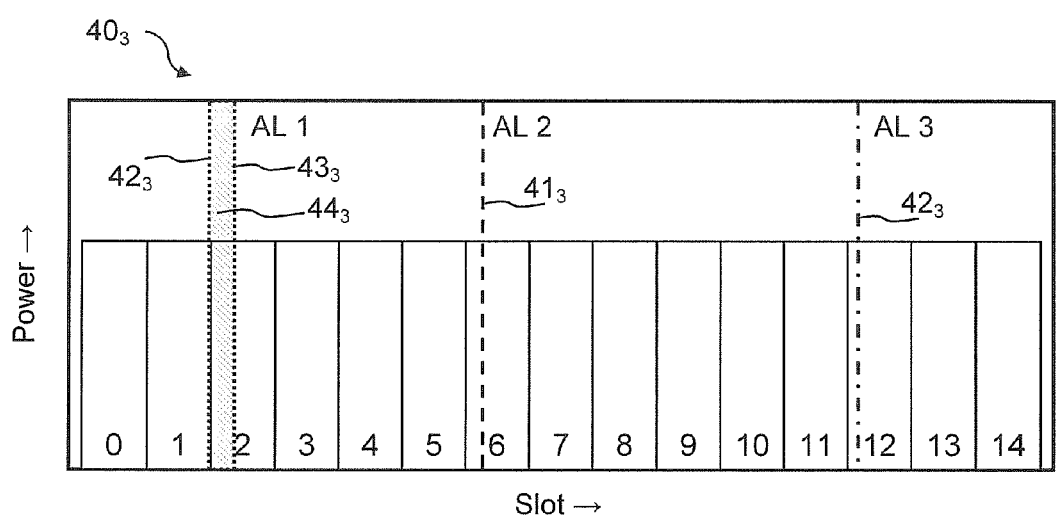
FIG. 4C a second window in the display device in which a power is displayed against the slots of the first partial signal and in which the analysis line according to the invention and the analysis range according to the invention are plotted at the timing point which corresponds to the timing point at which these are plotted in the first window.

FIG. 4C shows a second window in the display device 22 in which a power $40_3$ is displayed against the slots of the first partial signal $2_2$. The characteristic of the power $40_3$ against the slots is also calculated by the processing unit 10. The processing unit 10 inserts the analysis range $44_3$ in the second window in the time range which corresponds to the time range in which the first analysis range $44_1$ is displayed in the first window. The first analysis range $44_3$ in the exemplary embodiment from FIG. 4C occurs in slot two. The two analysis lines $41_3$ in slot six and $42_3$ in slot 12 are also displayed.

Figure 5A:
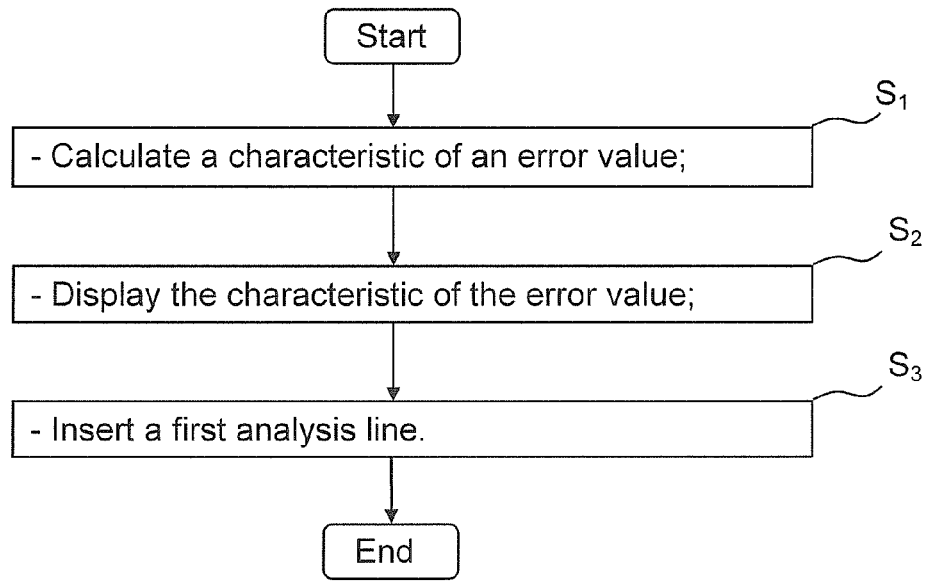
FIG. 5A a flow chart of an exemplary embodiment of the method according to the invention which describes the analysis line.

FIG. 5A describes a flow chart of an exemplary embodiment of the method according to the invention. In a first method step $S_1$, the characteristic of an error value $30_1$, especially of the EVM value $30_1$, is calculated by the processing unit 10 from the first partial signal $2_1$ against a given time period. The given time period is a time period which can be adjusted by a user and especially corresponds to a time period of one frame.

Following this, method step $S_2$ is performed. In method step $S_1$, the characteristic of the error value $30_1$, that is the EVM value $30_1$, is displayed in a first window in the display device 22 by the processing unit 10. The first partial signal $2_1$ can be a WCDMA signal.

Following this, method step $S_3$ is performed. In method step $S_3$, the processing unit 10 inserts a first analysis line $31_1$ at the timing point at which the characteristic of the error value $30_1$ overshoots a threshold value loaded by the processing unit 10 from a memory unit 16. In this context, it is particularly advantageous that a critical error value is automatically displayed to the user in that the processing unit 10 inserts a first analysis line $31_1$ at the corresponding timing point. On the basis of the level of the error value, which is an EVM value, the user can draw conclusions directly with regard to the modulation result.

Figure 5B:
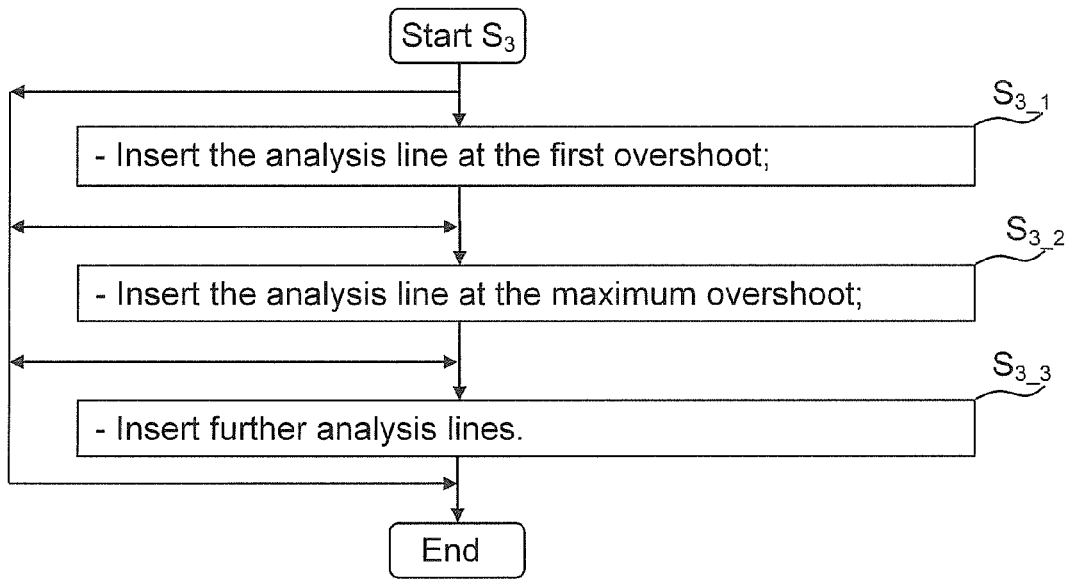
FIG. 5B a further flow chart of an exemplary embodiment of the method according to the invention which describes the analysis line in greater detail.

FIG. 5B describes a further flow chart of an exemplary embodiment of the method according to the invention which describes the analysis line $31_1$ in greater detail. The method step $S_3$ described can contain one or more of the following method steps $S_{3\_1}$, $S_{3\_2}$ or $S_{3\_3}$. Within method step $S_{3\_1}$, the processing unit 10 inserts a first analysis line $31_1$ in the first window directly at the first timing point at which the error value overshoots the threshold value loaded from a storage unit 16. As a result, the first EVM value which overshoots a specified threshold value within the frame is marked directly for a user.

As an alternative to this, method step $S_{3\_2}$ can be performed. In method step $S_{3\_2}$, the processing unit 10 inserts the first analysis line $31_1$ in the first window at the timing point at which the error value $30_1$ is highest, whereas, at the same time, the error value $30_1$ overshoots the threshold value loaded from a storage unit 16. This means that, as has been defined in FIG. 2, either no analysis line or precisely one first analysis line $31_1$ is inserted in the first window for each time segment to be analysed, which corresponds, in particular, to one frame.

Additionally or as an alternative, method step $S_{3\_3}$ can be performed. In method step $S_{3\_3}$, the processing unit 10 inserts further analysis lines in the first window at further timing points at which the error values $30_1$ overshoot the threshold value loaded from a storage unit 16. In this context, the number of further analysis lines is not limited. The analysis lines differ in their colour and/or their pattern from the characteristic of the error value $30_1$.

Figure 6:
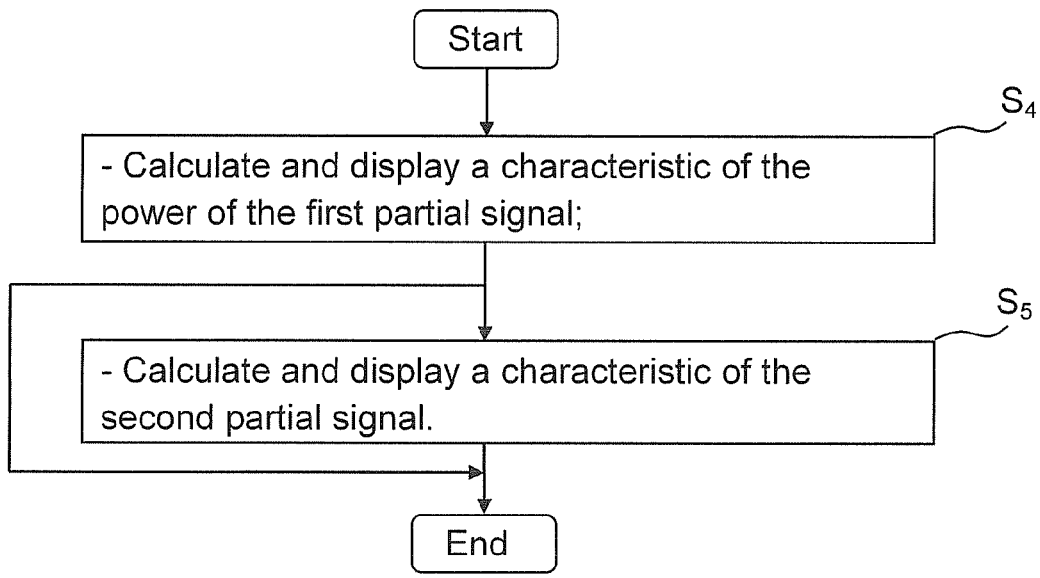
FIG. 6 a flow chart of an exemplary embodiment of the method according to the invention which describes how the analysis line is also inserted in other windows at an exact timing point.

FIG. 6 shows a flow chart of an exemplary embodiment of the method according to the invention which describes how the analysis line $31_1$ is also inserted into other windows at an exact timing point. For this purpose, method step $S_4$ is preferably performed following method step $S_3$. In method step $S_4$, the processing unit 10 calculates the characteristic of the power $30_3$ from the first partial signal $2_1$ and displays this in a second window in the display device 22. By preference, the power $30_3$ is plotted in this window against the individual slots. Furthermore, the processing unit 10 inserts a first analysis line $31_3$ in the second window at the timing point which corresponds to the timing point at which the first analysis line $31_1$ is displayed in the first window. This is achieved particularly simply in that the second window also has the same time scaling, namely, one frame, as the first window.

Following this, or as an alternative to method step $S_4$, method step $S_5$ can also be performed. In method step $S_5$, the characteristic of the power $30_2$ is calculated from the second partial signal $2_2$ by the processing unit 10 and displayed in a third window in the display device 22. The characteristic of the power $30_2$ is also preferably displayed in the time domain. Following this, the processing unit 10 inserts a first analysis line $31_2$ in the third window at the timing point which corresponds to the timing point at which the first analysis line $31_1$ is displayed in the first window. This is achieved particularly simply because both the first partial signal $2_1$ and also all further partial signals $2_2$, $2_3$, $2_4$ are calculated segment by segment, whereas the respective segments have exactly the same time duration, in particular, one frame.

Figure 7A:
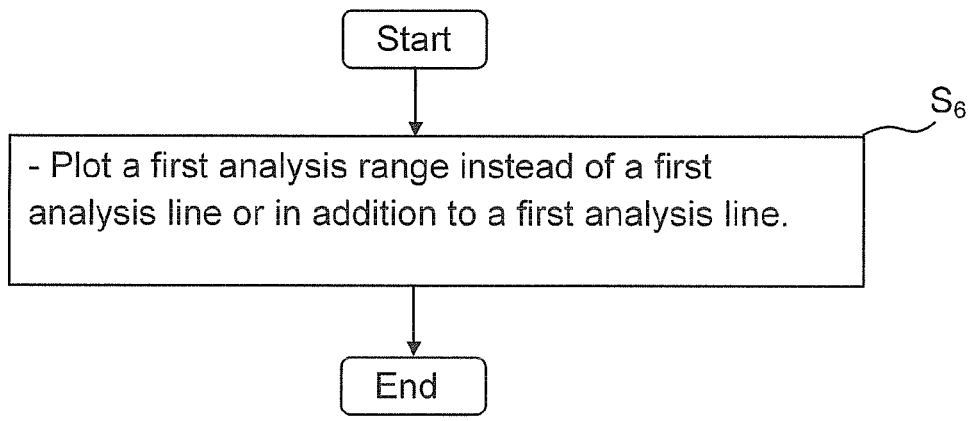
FIG. 7A a flow chart of an exemplary embodiment of the method according to the invention which describes an analysis range.

FIG. 7A shows a flow chart of an exemplary embodiment of the method according to the invention which describes an analysis range 40. Method step $S_6$ is performed for this purpose. In method step $S_6$, a first analysis range $44_1$ is inserted instead of a first analysis line $31_1$ or in addition to a first analysis line $41_1$ by the processing unit in a first window. The same, of course, also applies for the further analysis lines $42_1$. Accordingly, the first analysis range $44_1$ extends over a plurality of time-coherent error values $40_1$, whereas a first end $42_1$ of the first analysis range $44_1$ is formed from a first error value $40_1$, which overshoots a threshold value loaded from a storage unit 16. A second end $43_1$ of the first analysis range $44_1$ is formed from a further error value $40_1$ which overshoots a threshold value loaded from a storage unit 16. Exclusively error values $40_1$ which all overshoot the threshold value loaded from a storage unit 16 are disposed between the first end $42_1$ and the second end $43_1$ of the analysis range $44_1$.

The processing unit 10 checks whether an error value preceding the first error value in time no longer overshoots the threshold value and accordingly determines the beginning of the first end $42_1$. Similarly, the processing unit 10 checks whether an error value following the further error value overshoots the loaded threshold value. If the following error value no longer overshoots the threshold value by contrast with the further error value, the further error value then forms the second end $43_1$ of the first analysis range $44_1$. The first analysis range $44_1$ is preferably displayed in a colour and or with a contrast which differs from the previous colours and/or contrasts in the first window. The contrast of the first analysis range $44_1$ is preferably lower than that of the characteristic of the error values $40_1$, but higher than the structuring or the background of the first window.

Figure 7B:
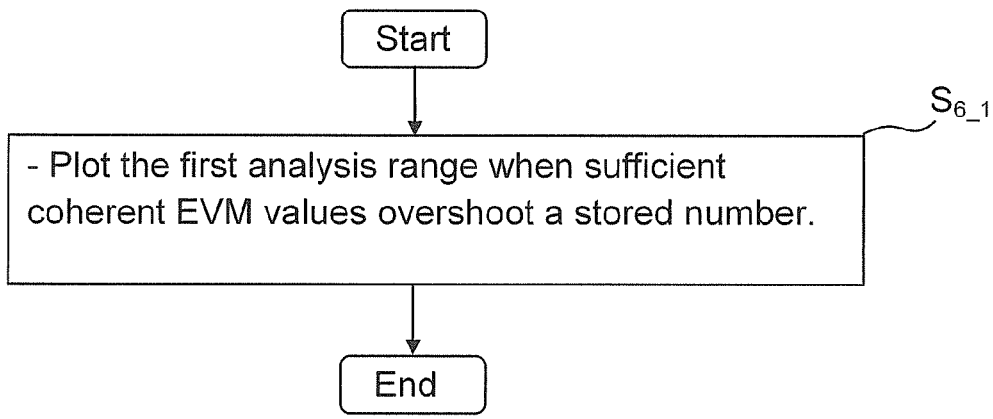
FIG. 7B a flow chart of an exemplary embodiment of the method according to the invention which describes when the analysis range is plotted.

FIG. 7B shows a flow chart of an exemplary embodiment of the method according to the invention which describes when the analysis range $44_1$ is plotted. Method step $S_{6\_1}$ is performed as far as possible within method step $S_6$ for this purpose. In method step $S_{6\_1}$, the first analysis range $44_1$ is plotted instead of a first analysis line $31_1$ or in addition to a first analysis line $41_1$ when the processing unit 10 recognises that the error values 30 which are disposed between the first end $42_1$ and the second end $43_1$ of the analysis range $44_1$ to be plotted overshoot a number stored in the storage unit 16. It remains to be determined that the first analysis range $44_1$ in the first window can be plotted alone or in addition to the one analysis line $41_1$ and/or to the further analysis lines $42_1$. If the stored number is not exceeded, a maximum of only one analysis line $41_1$, $42_1$ is plotted.

Figure 7C:
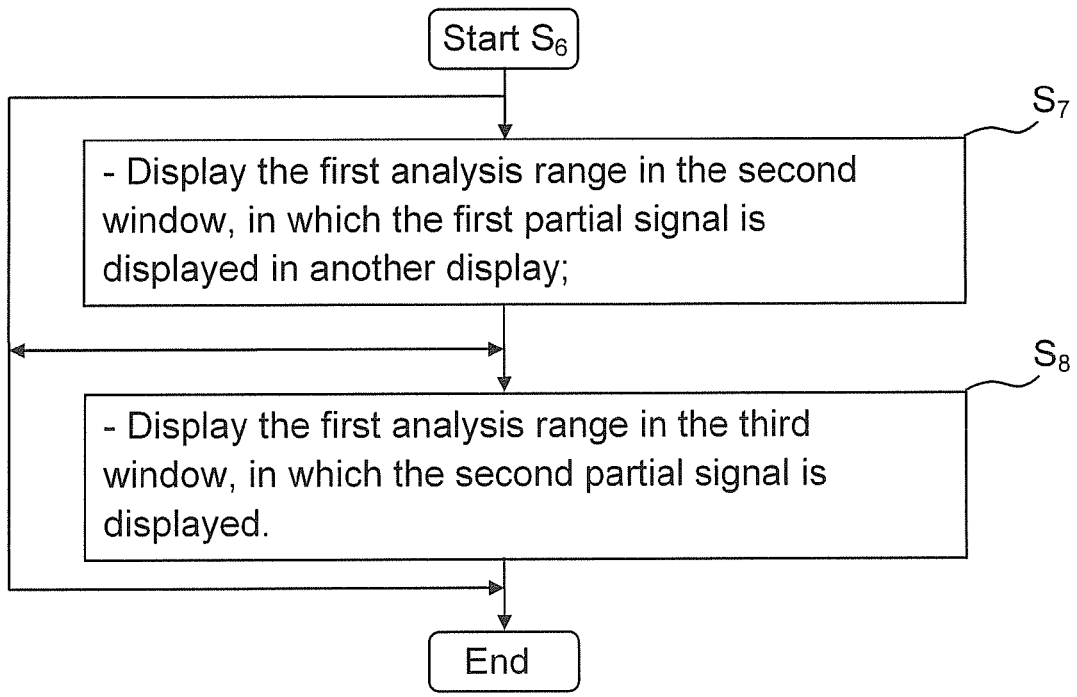
FIG. 7C a flow chart of an exemplary embodiment of the method according to the invention which describes how the analysis range is also inserted in other windows at an exact time range.

FIG. 7C shows a flow chart of an exemplary embodiment of the method according to the invention which describes how the analysis range $44_2$ is also inserted in other windows at an exact time range. For this purpose, method step $S_7$ can be performed after method step $S_6$ or method step $S_{6\_1}$. In method step $S_7$, the processing unit 10 calculates a characteristic of the power $40_2$ from the first partial signal and displays this characteristic in a second window in the display device 22. Following this, the processing unit 10 inserts a first analysis range $44_1$ in the second window at the time range which corresponds to the time range in which the first analysis range $44_1$ is displayed in the first window.

As an alternative or in addition to method step $S_7$, method step $S_8$ can be performed. In method step $S_8$, the processing unit 10 calculates the characteristic of the power $40_3$ in the second partial signal $2_2$ and displays this characteristic in a third window in the display device 22. The processing unit 10 inserts a first analysis range $44_3$ in the third window at the time range which corresponds to the time range in which the first analysis range 40 is displayed in the first window.

Figure 8:
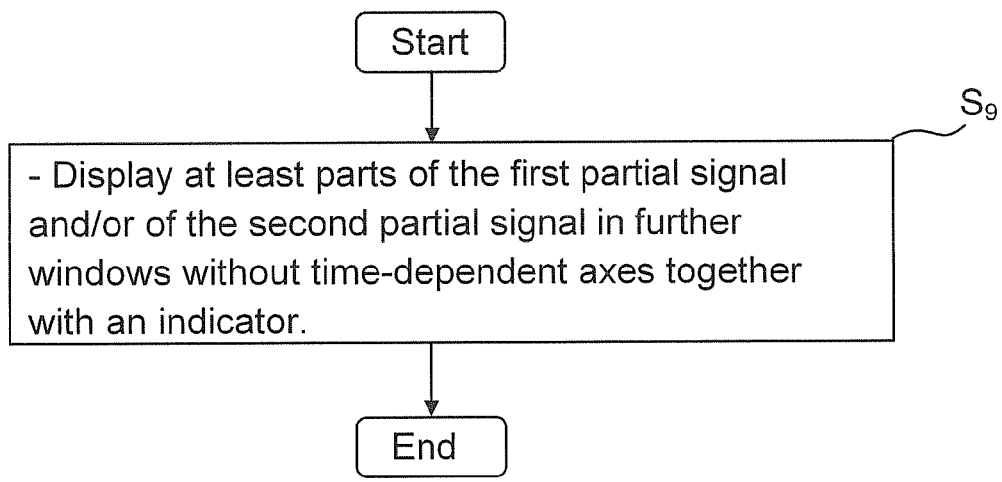
FIG. 8 a flow chart of an exemplary embodiment of the method according to the invention which describes an indicator which replaces an analysis line and/or an analysis range in diagrams without a time-dependent axis.

FIG. 8 shows a flow chart of an exemplary embodiment of the method according to the invention which describes an indicator $37_4$ which replaces an analysis line and/or an analysis range in diagrams without a time-dependent axis. For this purpose, method step $S_9$ is performed. In method step $S_9$, a processing unit 10 displays at least parts $30_4$ of the first partial signal $2_1$ and/or of the second partial signal $2_2$ in the further windows, whereas no time-dependent axes are present in this window. The processing unit 10 still displays an indicator $37_4$, especially in the form of a symbol or an alphabetic abbreviation, in the further window. This indicator $37_4$ signals that the error value $30_1$, at which an analysis line $31_1$ is inserted in the first window, flows into the display. Such an indicator can also be displayed in the further window if the error value $30_1$ at which an analysis range $44_1$ or a further analysis line $42_1$ is inserted in the first window flows into the display.

Overall, various partial signals $2_1$, $2_2$, $2_3$, $2_4$ can be displayed in different windows, whereas an analysis line $31_1$, $41_1$ or an analysis range $44_1$ inserted in one window marks the same timing point or respectively time range in all other windows as in the one window in which it is inserted, provided that the further windows have a time-dependent axis.

In addition to the analysis line $31_1$, $41_1$ or the analysis range $44_1$, those error values $30_1$ in the first window which overshoot the threshold value and/or to which an analysis line $31_1$, $41_1$ or an analysis range $44_1$ is assigned can be displayed in a different colour from the other error values $30_1$, so that a user immediately recognises the error values $30_1$ which overshoot the threshold value. By contrast, dependent upon the display selected in the other windows, the other signal components which correspond with the timing points at which the error values $30_1$ in the first window overshoot the threshold value can also be displayed in the same colour.

Within the framework of the invention, all of the features described and/or illustrated can be combined with one another as required. In particular, the dependent claims relating to the method can also be combined with the device claims relating to the measuring device and vice versa.

The terms and expressions which have been employed in the foregoing specification are used therein as terms of description and not of limitation, and there is no intention in the use of such terms and expressions of excluding equivalence of the features shown and described or portions thereof, it being recognized that the scope of the invention is defined and limited only by the claims which follow.

What is claimed is:

1. A measuring device with a storage unit, a processing unit and a display device for the display of a digitised and stored first partial signal and at least one digitised and stored second partial signal,
   wherein the first partial signal and the second partial signal are partial signals of different bands of a multiband signal,
   wherein the processing unit is embodied to display
      a first signal derived from the first partial signal and a first analysis line in a first window in the display device, and
      a second signal derived from the second partial signal and a first analysis line corresponding to the first analysis line of the first window in a second window in the display device.

2. The measuring device according to claim 1,
   wherein the processing device calculates from the first partial signal the characteristic of an error value over a given time period and displays it as a first signal in a first window in the display device, and
   wherein the processing unit inserts the first analysis line in the first window at the timing point at which the characteristic of the error value overshoots a threshold value loaded by the processing unit from a storage unit.

3. The measuring device according to claim 2,
   wherein the processing device inserts the first analysis line in the first window at the first timing point at which the error value overshoots the threshold value loaded from a storage unit and/or
   wherein the processing unit inserts the first analysis line in the first window at the timing point at which the error value is highest and overshoots the threshold value loaded from a storage unit and/or wherein the processing unit inserts further analysis lines in the first window at further timing points at which the error values overshoot the threshold value loaded from a storage unit.

4. The measuring device according to claim 3,
wherein the processing unit calculates from the first partial signal a characteristic of the power and displays it in the second window in the display device and
wherein the processing unit inserts a first analysis range in the second window at the time range which corresponds to the time range in which the first analysis range is displayed in the first window and/or
wherein the processing unit calculates from the second partial signal a characteristic of the power and displays it in a third window in the display device and
wherein the processing unit inserts a first analysis range in the third window at the time range which corresponds to the time range in which the first analysis range is displayed in the first window.

5. The measuring device according to claim 2,
wherein processing unit calculates from the first partial signal a characteristic of the power and displays it in the second window on the display device, and wherein the processing unit inserts a first analysis line in the second window at the timing point which corresponds to the timing point at which the first analysis line is displayed in the first window and/or
wherein the processing unit calculates from the second partial signal a characteristic of the power and displays it in a third window in the display device, and
wherein the processing unit inserts a first analysis line in the third window at the timing point which corresponds to the timing point at which the first analysis line is displayed in the first window.

6. The measuring device according to claim 2,
wherein in addition to a first analysis line, the processing unit plots in the first window a first analysis range which extends over a plurality of time-coherent error values, whereas a first error value which overshoots a threshold value loaded from a storage unit forms a first end of the analysis range,
whereas a further error value which overshoots a threshold value loaded from a storage unit represents a second end of the analysis range, and
whereas the error values disposed between the first end and the second end of the analysis range all overshoot the threshold value loaded from a storage unit.

7. The measuring device according to claim 6,
wherein the processing unit plots a first analysis range when the error values which are disposed between the first end and the second end of the analysis range to be plotted overshoot a number stored in the storage unit.

8. The measuring device according to claim 1,
wherein the processing unit displays at least parts of the first partial signal and/or of the second partial signal in further windows, whereas the display does not contain a time-dependent axis, whereas an indicator, especially in the form of a symbol or alphabetic abbreviation within the further windows, signals that of the error value, at which the processing unit inserts a first analysis line in the first window, flows into the display.

9. The measuring device according to claim 1,
wherein the first partial signal is a WCDMA signal and/or wherein the error value is an EVM value, and that the characteristic of the EVM value is plotted in the first window against various chips and/or wherein the power is plotted in the second window against the slots and/or wherein the power of the code domain is plotted in the second window and/or
wherein the second partial signal is a TDMA signal, especially a GSM signal, and/or wherein the power of the second partial signal is plotted in the third window in the time domain.

10. A method for displaying a digitised and stored first partial signal and at least one digitised and stored second partial signal of a multiband signal in a display device with the following method steps:
calculating of a first signal which is derived from the first partial signal;
displaying of the first signal and of a first analysis line in a first window in the display device;
calculating of a second signal which is derived from the second partial signal;
displaying of the second signal and of a first analysis line in a second window of the display device corresponding to the first analysis line of the first window.

11. The method according to claim 10,
wherein the first signal is a characteristic of an error value of the first partial signal over a given time period, and
wherein the first analysis line is inserted at the time at which the characteristic of the error value overshoots a specified threshold value.

12. The method according to claim 11, with the following method steps:
insertion of the first analysis line in the first window at the first timing point at which the error value overshoots the threshold value and/or
insertion of the first analysis line in the first window at the timing point at which the error value is highest and overshoots the threshold value; and/or
insertion of further analysis lines in the first window at further timing points at which the error values overshoot the threshold value.

13. The method according to claim 10, with the following method steps:
calculation of a characteristic of the power from the first partial signal, display of the characteristic in a second window in the display device and insertion of a first analysis line in the second window at the time which corresponds to the time at which the first analysis line is displayed in the first window; and/or
calculation of a characteristic of the power from the second partial signal, display of the characteristic in a third window in the display device and insertion of a first analysis line in the third window at the time which corresponds to the time at which the first analysis line is displayed in the first window.

14. The method according to claim 10, with following method steps:
plotting of a first analysis range which extends over a plurality of time-coherent error values, in addition to a first analysis line in the first window, formation of a first end of the first analysis range from a first error value which overshoots the threshold value and formation of a second end of the first analysis range from a further error value which overshoots a threshold value, whereas the error values disposed between the first end and the second end of the first analysis range all overshoot the threshold value.

15. The method according to claim 14, with the following method steps:
plotting of the first analysis range in addition to a first analysis line when it is recognised that the error values which are disposed between the first end and the second end of the first analysis range to be plotted overshoot a stored number.

16. The method according to claim 14, with the following method steps:

calculation of a characteristic of the power from the first partial signal, display of the characteristic in a second window in the display device and insertion of a first analysis range in the second window at the time range which corresponds to the time range within which the first analysis range is displayed in the first window; and/or calculation of a characteristic of the power from the second partial signal, display of the characteristic in a third window in the display device and insertion of a first analysis range in the third window at the time range which corresponds to the time range within which the first analysis range is displayed in the first window.

17. The method according to claim 10, with display of at least parts of the first partial signal and/or of the second partial signal in further windows, whereas no time dependent axes are displayed, whereas an indicator, especially in the form of a symbol or alphabetic abbreviation within the further window, which signals that the error value at which a first analysis line is inserted in the first window flows into the display.

\* \* \* \* \*